United States Patent
Read

(10) Patent No.: US 10,211,181 B2
(45) Date of Patent: *Feb. 19, 2019

(54) DEVICES AND METHODS RELATED TO SINGULATED RADIO-FREQUENCY DEVICES

(71) Applicant: SKYWORKS SOLUTIONS, INC., Woburn, MA (US)

(72) Inventor: Matthew Sean Read, Rancho Santa Margarita, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/485,134

(22) Filed: Apr. 11, 2017

(65) Prior Publication Data
US 2017/0352643 A1   Dec. 7, 2017

Related U.S. Application Data

(63) Continuation of application No. 14/710,114, filed on May 12, 2015, now Pat. No. 9,627,352.

(Continued)

(51) Int. Cl.
| | |
|---|---|
| *H01L 23/34* | (2006.01) |
| *H01L 21/00* | (2006.01) |
| *H01L 23/00* | (2006.01) |
| *H01L 21/683* | (2006.01) |
| *H01L 21/67* | (2006.01) |

(Continued)

(52) U.S. Cl.
CPC ............ *H01L 24/97* (2013.01); *H01L 21/561* (2013.01); *H01L 21/67132* (2013.01); *H01L 21/67259* (2013.01); *H01L 21/6838* (2013.01); *H01L 23/552* (2013.01); *H01L 23/66* (2013.01); *H01L 24/95* (2013.01); *H01L 23/3121* (2013.01); *H01L 24/16* (2013.01); *H01L 24/32* (2013.01); *H01L 24/48* (2013.01); *H01L 24/73* (2013.01); *H01L 25/0652* (2013.01); *H01L 25/0655* (2013.01); *H01L 2224/16225* (2013.01); *H01L 2224/32225* (2013.01); *H01L 2224/48091* (2013.01); *H01L 2224/48227* (2013.01); *H01L 2224/73265* (2013.01); *H01L 2224/97* (2013.01); *H01L 2924/00014* (2013.01); *H01L 2924/1421* (2013.01); *H01L 2924/15311* (2013.01); *H01L 2924/15313* (2013.01); *H01L 2924/181* (2013.01)

(58) Field of Classification Search
CPC ....... H01L 24/97; H01L 21/561; H01L 24/95; H01L 21/67132; H01L 21/67259; H01L 21/6838; H01L 23/552; H01L 23/66
See application file for complete search history.

(56) References Cited

U.S. PATENT DOCUMENTS 9,627,352 B2 *   4/2017   Read ................ H01L 21/67259

* cited by examiner

*Primary Examiner* — Alonzo Chambliss
(74) *Attorney, Agent, or Firm* — Chang & Hale LLP

(57) ABSTRACT

Devices and methods for processing singulated radio-frequency (RF) units. In some embodiments, a device for processing singulated RF packages can include a plate having a plurality of apertures. Each aperture can be dimensioned to receive and position a singulated RF package to thereby facilitate processing of the singulated RF packages positioned in their respective apertures. In some embodiments, such a device can be utilized to batch process high volume of RF packages as if the RF packages are still in a panel format.

20 Claims, 10 Drawing Sheets

Related U.S. Application Data

(60) Provisional application No. 61/992,156, filed on May 12, 2014, provisional application No. 62/031,816, filed on Jul. 31, 2014.

(51) Int. Cl.
*H01L 23/66* (2006.01)
*H01L 21/56* (2006.01)
*H01L 23/552* (2006.01)
*H01L 23/31* (2006.01)
*H01L 25/065* (2006.01)

DEVICES AND METHODS RELATED TO SINGULATED RADIO-FREQUENCY DEVICES

CROSS-REFERENCE TO RELATED APPLICATION(S)

This application is a continuation of U.S. patent application Ser. No. 14/710,114 filed May 12, 2015, entitled DEVICES AND METHODS FOR PROCESSING SINGULATED RADIO-FREQUENCY UNITS, which claims priority to U.S. Provisional Application Nos. 61/992,156 filed May 12, 2014, entitled RADIO-FREQUENCY DEVICES PACKAGED ON CERAMIC SUBSTRATES, AND APPARATUS AND METHODS FOR HIGH VOLUME MANUFACTURING, and 62/031,816 filed Jul. 31, 2014, entitled DEVICES AND METHODS RELATED TO PROCESSING SINGULATED RADIO-FREQUENCY UNITS, the disclosure of each of which is hereby expressly incorporated by reference herein in its entirety.

BACKGROUND

Field

The present disclosure relates to fabrication of packaged electronic modules such as radio-frequency (RF) modules.

Description of the Related Art

In radio-frequency (RF) applications, RF circuits and related devices can be implemented in a packaged module. Such a packaged module can then be mounted on a circuit board such as a phone board.

SUMMARY

According to a number of implementations, the present disclosure relates to a device for processing singulated radio-frequency (RF) packages. The device includes a plate having a plurality of apertures, with each aperture being dimensioned to receive and position a singulated RF package to thereby facilitate processing of the singulated RF packages positioned in their respective apertures.

In some embodiments, each of the apertures can have a rectangular shape having dimensions selected to allow the receiving and positioning of the singulated RF package therein. The dimensions of the rectangular shape of the aperture can be selected to provide sufficiently accurate positioning of the singulated RF package relative to the plate. The aperture can include a relief feature at one or more corners of the rectangular shaped aperture, with each relief feature being dimensioned to allow fitting of a corresponding corner of the singulated RF package. In some embodiments, each of the four corners of the aperture can include the relief feature.

In some embodiments, the plate can include one or more features configured to provide indexing and/or alignment functionality. The plate can have, for example, a rectangular shape. At least some of the one or more indexing/alignment features can be positioned along a selected edge of the rectangular plate.

In some embodiments, the plate can include an upper side and a lower side. The lower side can be configured to receive a tape such that the apertures expose respective portions of an adhesive side of the tape to thereby facilitate holding of the singulated RF packages positioned in the apertures. The tape can be configured to withstand conditions associated with the processing of the singulated RF packages. The plate can include one or more tape-removal features configured to facilitate removal of the tape from the lower side of the plate. The one or more tape-removal features can include one or more notches implemented on a selected edge of the plate.

In some embodiments, the plate can have a wafer-like shape. The apertures can be dimensioned to receive and position the singulated RF packages to facilitate a conformal shield deposition process. The conformal shield deposition process can include a sputter deposition process.

In some embodiments, the plate can have a thickness selected to allow the singulated RF packages to be positioned and retained in their respective apertures in a desired manner during the processing of the singulated RF packages. The singulated RF packages can be, for example, shielded RF packages. Each of the shielded RF packages can include a conformal shielding layer that covers an upper surface and at least some side walls of the shielded RF package. The thickness can be selected to allow the shielded RF packages to be positioned in their respective apertures in an inverted orientation to allow one or more process steps to be performed on undersides of the shielded RF packages. The shielded RF packages can be configured to yield dual-sided RF packages.

In some embodiments, the singulated RF packages can be un-shielded RF packages. The thickness of the plate can be selected to allow formation of a conformal shielding layer that covers an upper surface and at least some side walls of the singulated RF package.

In some teachings, the present disclosure relates to a method for processing singulated radio-frequency (RF) packages. The method includes positioning a plurality of singulated RF packages into respective apertures defined by a plate, such that the singulated RF packages are held in a desired array. The method further includes performing one or more process steps on the singulated RF packages while the singulated RF packages are held by the plate.

In some embodiments, the method can further include applying a tape on one side of the plate prior to the positioning of the singulated RF packages into the apertures, such that respective portions of an adhesive side of the tape are exposed through the apertures to thereby facilitate the holding of the singulated RF packages. The singulated RF packages can be, for example, shielded RF packages, Each shielded RF package can include a conformal shielding layer that covers an upper surface and at least some side walls of the shielded RF package. The positioning can include placing an inverted shielded RF package into the respective aperture to allow the one or more process steps to be performed on an underside of the shielded RF package. The shielded RF packages can be configured to yield dual-sided RF packages, and the one or more process steps can include mounting of a lower component on the underside of the shielded RF package. The lower component can be, for example, a semiconductor die. The lower component can be mounted to an underside of a packaging substrate of the shielded RF package. The method can further include forming a ball-grid array (BGA) on the underside of the packaging substrate, with the BGA being arranged relative to the lower component, and the BGA being dimensioned to allow the shielded RF package to be mounted on a circuit board with the lower component. The BGA can be arranged to form a perimeter around the lower component.

In some embodiments, the method can further include holding each of the singulated RF package on the side where the one or more process steps are performed. Such a holding can include, for example, applying a vacuum. The method can further include removing the tape from the plate such that the relative positions of the singulated RF packages are maintained by the vacuum. The tape is removed while the tape is above the plate. The method can further include removing the plate from the singulated RF packages being held by the vacuum. The method can further include positioning the singulated RF packages at a selected location by releasing the vacuum on the singulated RF packages. The positioning of the singulated RF packages can include substantially maintaining the relative positions of at least some of the singulated RF packages. The positioning of the singulated RF packages can include releasing the singulated RF packages into a container.

In some embodiments, the method can further include applying vacuum to the singulated RF packages positioned in their respective apertures of the plate. The method can further include applying a tape on one side of the plate after the singulated RF packages are being held by the vacuum, such that respective portions of an adhesive side of the tape engage the plate and portions of the singulated RF packages exposed through the apertures. The side on which the tape is applied can be opposite from the side of the plate on which the vacuum is applied to the singulated RF packages. The method can further include removing the vacuum applied to the singulated RF packages.

In some embodiments, the positioning of the singulated RF packages can include providing a loading plate above the plate to facilitate easier insertion of the singulated RF packages into their respective apertures of the plate. The loading plate can include a plurality of loading apertures arranged to substantially match with the apertures of the plate. Each loading aperture can include side walls that are beveled to facilitate the easier insertion.

In some embodiments, the performing of one or more process steps can include forming a conformal shielding layer on each singulated RF package while the singulated RF packages are held by the plate.

In some implementations, the present disclosure relates to a system for batch processing of singulated radio-frequency (RF) packages. The system includes an apparatus configured for holding singulated RF packages. The apparatus includes a plurality of frame carriers, with each frame carrier having a plurality of apertures dimensioned to receive and position an array of singulated RF packages. The system further includes a handling apparatus configured to receive the plurality of frame carriers. Each frame carrier is loaded with the array of singulated RF packages. The handling apparatus is further configured to allow batch processing of the singulated RF packages loaded in their respective frame carriers.

In some embodiments, the apparatus for holding singulated RF packages can include a loading plate configured to be positioned over a frame carrier as the respective array of RF packages are being positioned in the apertures. The loading plate can include a plurality of loading apertures, with each loading aperture including beveled side walls dimensioned to facilitate easier positioning of the RF package into the corresponding aperture of the frame carrier.

In some embodiments, the handling apparatus can include a magazine configured to receive the plurality of loaded frame carriers. The magazine can be further configured to facilitate the batch processing of the singulated RF packages loaded in the frame carriers as if they are still in a panel format.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

In many manufacturing applications involving fabrication of packaged modules such as radio-frequency (RF) modules, it is necessary or desirable to perform at least some process steps on singulated units. Various examples related to such process steps on singulated units are described herein in greater detail.

In some embodiments, some or all of the foregoing process steps involving the singulated units can be facilitated by a frame carrier having one or more features as described herein. As also described herein, such a frame carrier and related techniques can allow, for example, high-volume processing of singulated units with desirable precision. Although various examples are described herein in the context of RF modules, it will be understood that one or more features of the present disclosure can also be implemented for processing of other types of packaged electronic modules.

Figure 1A:
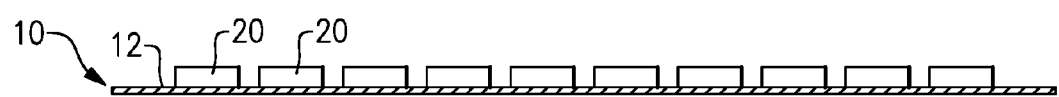
FIGS. 1A and 1B show side and plan views of a plurality of single radio-frequency (RF) units being held together in an array.
Figure 1B:
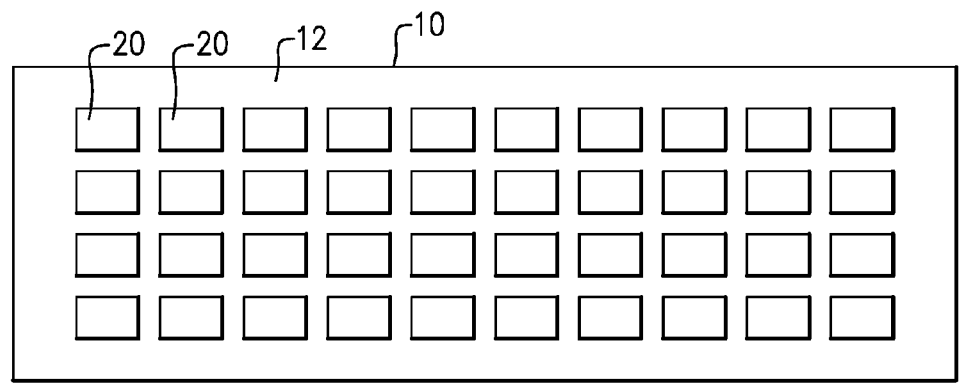

FIGS. 1A and 1B show side and plan views of a plurality of single radio-frequency (RF) units 20 being held together in an array. Such units can be held together by, for example, an adhesive surface 12 of a tape 10. Such units held by the tape 10 can be processed further. Examples of situations where processing of such units in singulated form are described herein in greater detail.

Depending on the type of operations and related handling processes, the foregoing technique of holding the single units (also referred to herein as individual units) can be problematic. Described herein are devices and methods that can allow processing of single units in an improved manner.

Figure 2:
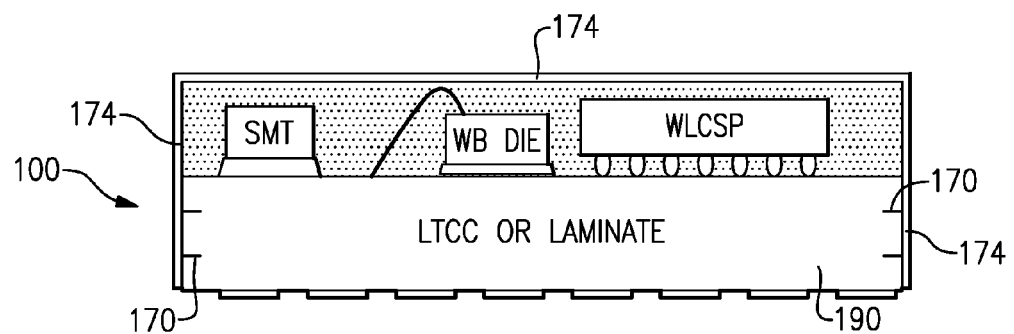
FIG. 2 shows an example of a packaged RF module that can be fabricated by having at least some portion of its fabrication process be performed after being singulated from, for example, a panel format.
Figure 3:
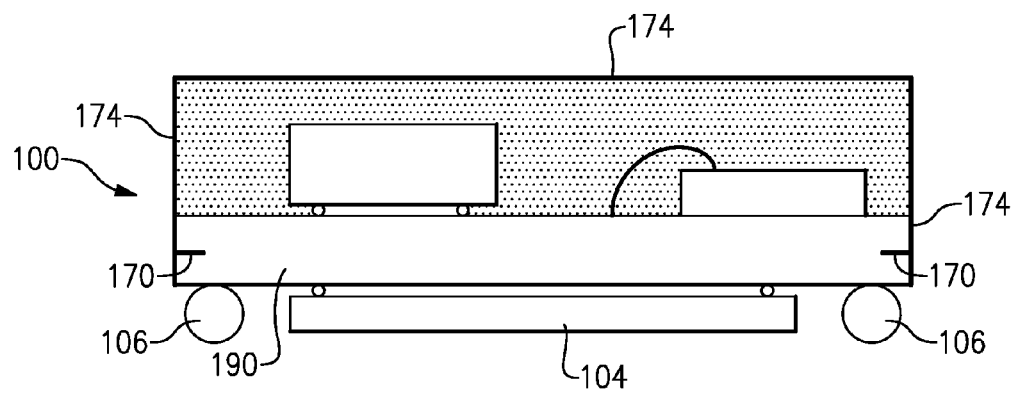
FIG. 3 shows another example of a packaged RF module that can be fabricated by having at least some portion of its fabrication process be performed after being singulated from, for example, a panel format.

FIGS. 2 and 3 show non-limiting examples of packaged RF modules that can be fabricated by having at least some portions of their fabrication processes be performed after being singulated from, for example, a panel format (where an array of attached units are processed together). In each of the examples of FIGS. 2 and 3, a packaged RF module 100 includes a conformal shielding layer 174 that covers the upper surface and some or all of the side walls. Because of such side-wall coverage of the conformal shielding layer 174, it is desirable for the corresponding side wall to be exposed (e.g., by being separated from neighboring unit(s)) before application of the conformal shielding layer 174. Aside from the application of the conformal shielding layer 174, there may be additional processing steps that can be performed on the single units to yield the packaged RF modules 100 such as the examples of FIGS. 2 and 3.

It is noted that various examples are described herein in the context of side-wall application of conformal shielding layers, in which singulation prior to formation of such conformal shielding layers is desirable. However, it will be understood one or more features of the present disclosure can also be applied to manufacturing processes that do not necessarily involve side-wall application of conformal shielding layers. For example, there may be other module fabrication techniques in which it is desirable to perform one or more processing steps after individual units are singulated.

FIG. 2 shows that in some embodiments, devices and methods related to processing of single units as described herein can be applied to a single-sided RF module 100. For example, the module 100 is shown to include a packaging substrate 190 configured to receive one or more components on one side (e.g., on the upper side). Such a packaging substrate can include, for example, a ceramic substrate such as a low-temperature co-fired ceramic (LTCC) substrate, or a laminate substrate. Such components mounted to the upper side of the packaging substrate 190 can include, for example, a surface-mount technology (SMT) component, a wirebond-connected semiconductor die, and/or a flip-chip device such as a wafer level chip scale package (WLCSP). Other types of components can also be mounted on the packaging substrate 190. In the example of FIG. 2, such components are shown to be encapsulated by an overmold that provides the upper surface and parts of the side walls for the conformal shielding layer 174.

The underside of the packaging substrate 190 can include, for example, a plurality of contact pads that are electrically connected to, for example, some or all of the components mounted on the upper side. Some of such contact pads can also be electrically connected to a ground plane within the packaging substrate 190. In some embodiments, such contact pads can be pre-fabricated during the manufacturing of the packaging substrate 190.

In the example of FIG. 2, one or more conductive features 170 are shown to be implemented in the packaging substrate 190, such that one end is in electrical contact with the conformal shielding layer 174. Although not shown, the conductive features 170 are also electrically connected to the ground plane within the packaging substrate. Accordingly, such an electrical connection between the conformal shielding layer 174 and the ground plane (through the conductive features 170) provides RF shielding functionality for the module 100. Additional details concerning such a shielded module can be found in, for example, U.S. Patent Application Publication No. 2015/0126134 entitled DEVICES AND METHODS RELATED TO PACKAGING OF RADIO-FREQUENCY DEVICES ON CERAMIC SUBSTRATES which is hereby expressly incorporated by reference herein in its entirety.

FIG. 3 shows that in some embodiments, devices and methods related to processing of single units as described herein can be applied to dual-sided RF modules 100. For example, a module 100 in FIG. 3 is shown to include a packaging substrate 190 configured to receive one or more components on one side (e.g., on the upper side), and one or more components on the other side (e.g., on the lower side).

In some embodiments, the components mounted on the upper side of the packaging substrates 190 in the example of FIG. 3 can be similar to those described in reference to FIG. 2. Similarly, conformal shielding layers 174 and their respective conductive features 170 in the example of FIG. 3 can be similar to those described in reference to FIG. 2.

In the example of FIG. 3, the underside of the packaging substrate 190 is shown to include a ball-grid array (BGA) 106 and a lower component 104 mounted in an underside space defined by the packaging substrate 190 and the BGA 106. Additional details concerning such a dual-sided packaged module can be found in U.S. Provisional Application No. 62/031,815 entitled DUAL-SIDED RADIO-FREQUENCY PACKAGE HAVING BALL GRID ARRAY which is hereby expressly incorporated by reference herein in its entirety.

FIGS. 4A-4D show various stages of an example fabrication process in which a significant portion of the process can be performed after individual units are singulated. It will be understood that such individual units can be for single-sided or dual-sided packages as described herein.

In some embodiments, processing of most or all of upper and/or lower sides of a substrate panel can be achieved while the individual units remain together in a panel format. For example, modules that do not include conductive coating for side walls (e.g., to provide shielding) can have most or all of processing steps performed while in a panel format. However, when one or more side walls include shielding features, at least some of processing steps related to such shielding need to be implemented with the corresponding side wall(s) exposed. In some embodiments (e.g., where all four side walls include shielding features), at least some processing need to be performed on singulated units.

Figure 4A:
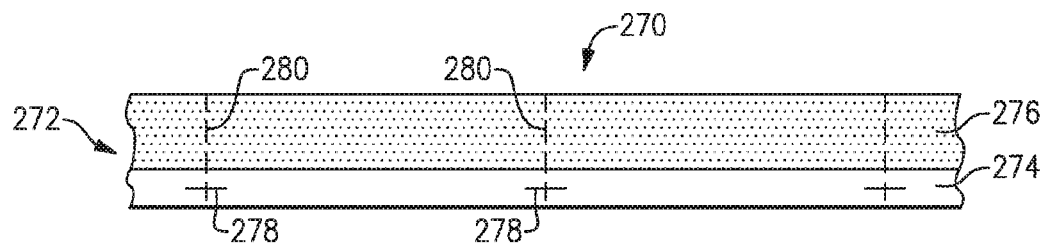
FIGS. 4A-4D show various stages of an example fabrication process in which a significant portion of the process is performed after individual units are singulated.

FIGS. 4A-4D show various states of an example process that can be implemented to yield singulated units having shielding features on some or all side walls. Referring to FIG. 4A, a fabrication state 270 can include a panel 272 having a plurality of to-be-singulated units. For example, singulation can occur at boundaries depicted by dashed lines 280 so as to yield singulated individual units. The panel 272 is shown to include a substrate panel 274 on which upper portions (collectively indicated as 276) are formed. Each unit of such an upper-portion panel can include various parts described herein in reference to FIGS. 2 and 3. Such parts can include various components mounted or implemented on the substrate panel 274. The upper-portion panel 276 can also include an overmold layer which can be formed as a common layer for of the to-be-singulated individual units.

In the example of FIG. 4A, conductive features 278 are shown to be implemented within the substrate panel 274. Each conductive feature 278 can straddle the corresponding boundary 278, such than when separation occurs at the boundary 278, each of the two exposed side walls of the substrates includes an exposed portion of the conductive feature 278 that has been cut. Each of such a cut conductive feature is electrically connected to a ground plane (not shown) within the corresponding substrate.

Figure 4B:
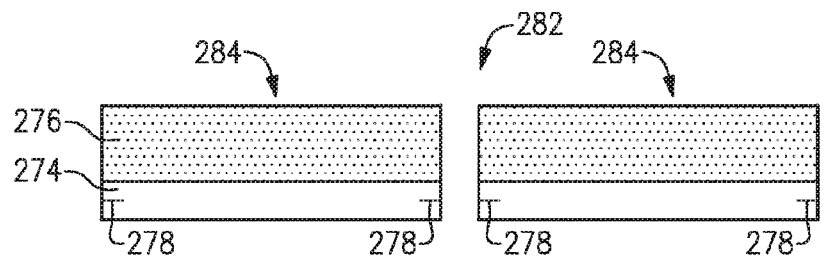

Referring to FIG. 4B, a fabrication state 282 can include a plurality of individual units 284 resulting from singulations along the boundary lines (280 in FIG. 4A). As described above, each of the individual units 284 includes side walls; and each side wall is shown to include an exposed portion of the cut conductive feature 278.

Figure 4C:
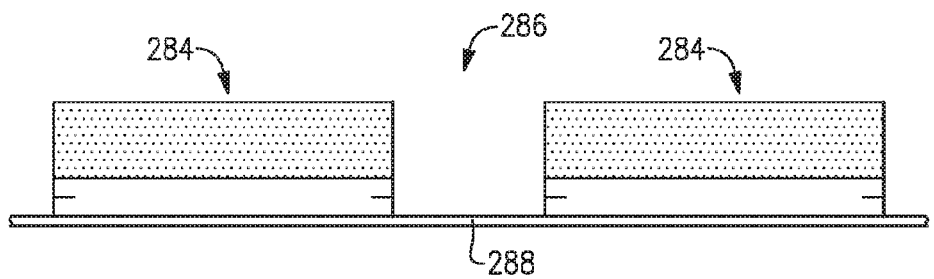

Referring to FIG. 4C, a fabrication state 286 can include the individual units 284 being positioned for formation of a conformal conductive layer. In some embodiments, the individual units 284 can be mounted on a tape 288 to be temporarily held in place during the formation of the conformal conductive layer. The individual units 284 can be positioned with sufficient spacing to allow effective formation of the conformal conductive layer on the side walls.

Figure 4D:
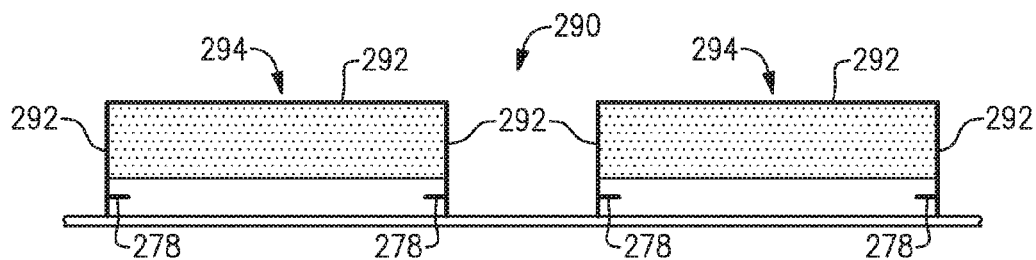

Referring to FIG. 4D, a fabrication state 290 can include formation of a conformal conductive layer 292 on the upper surface and the side surfaces of each of the individual units (284 in FIG. 4C) mounted on the tape 288. The conductive layer 292, in combination with the ground plane (connected through the conductive features 278), can provide shielding functionality for a volume generally contained therein. In the example of FIG. 4D, each of the resulting individual units 294 can be any of the shielded packages described in reference to FIGS. 2 and 3.

For the examples of FIGS. 4A-4D, the side coverage of the conformal conductive layer on each unit necessitates or makes it desirable that at least some steps be performed after the singulation step. Such post-singulation step(s) can include, for example, formation of conformal conductive layer, as well as any further processing steps on upper and/or lower surfaces of the individual units.

Figure 5:
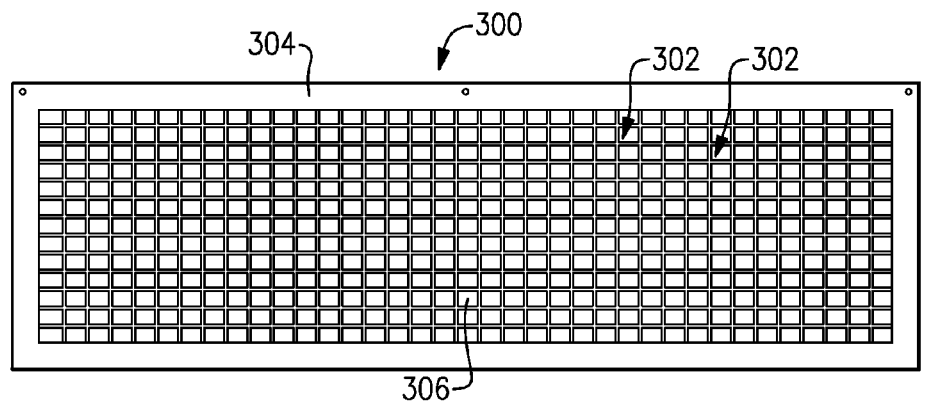
FIG. 5 shows a frame carrier having an array of apertures defined on a plate.
Figure 6:
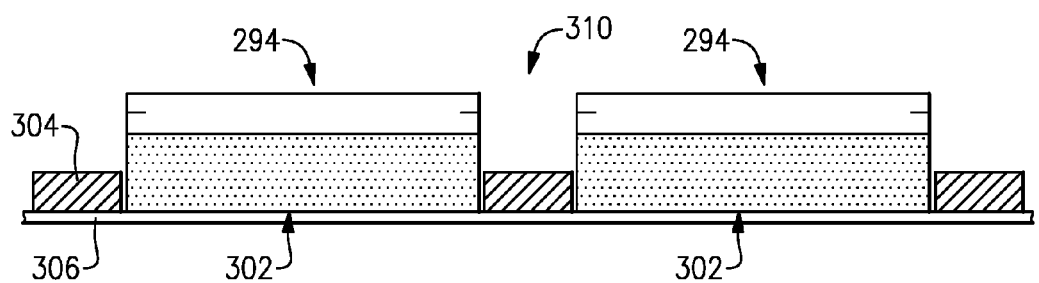
FIG. 6 shows an example process state where individual units are positioned in their respective apertures of the frame carrier of FIG. 5.

FIGS. 5 and 6 show examples where a plurality of individual units can be processed together in an array. Such processing of the individual units can yield, for example, dual-sided packages of single-sided packages. In the context of dual-sided packages, additional details concerning such individual units can be found in the above-referenced U.S. Provisional Application No. 62/031,815.

FIG. 5 shows a frame carrier 300 having a plate 304 with an array of apertures 302. Each of such apertures can be dimensioned to receive an individual unit, such that a plurality of such individual units can be arranged in an array for further processing. In FIG. 5, a tape 306 is shown to be provided underneath the frame carrier 300, such that an adhesive side engages the plate 304 and the apertures 302 expose the corresponding portions of the adhesive side. Thus, an individual unit positioned in an aperture 302 can be temporarily held in place by the tape 306.

FIG. 6 shows an example process state 310 where individual units 294 are positioned in their respective apertures 302 of the plate 304 of the frame carrier 300. In the example of FIG. 6, each individual unit 294 is depicted as being mounted inverted such that the overmold is held by the tape 306 and its underside is exposed for further processing. Such an orientation can allow, for example, underside processing of individual units to yield dual-sided packages. Once the individual units 294 are arranged in the foregoing manner, some or all of the subsequent steps can be performed as if the units are in a panel format.

FIGS. 7-13 show more examples of the frame carrier 300 described in reference to FIGS. 5 and 6. As previously described, it will be understood that one or more features associated with the frame carrier 300 can be utilized in various applications involving processing of individual units such as, for example, singulated units being processed to yield dual-sided packages with or without shielding functionality, and singulated units being processed to yield single sided packages with or without shielding functionality.

Figure 7A:
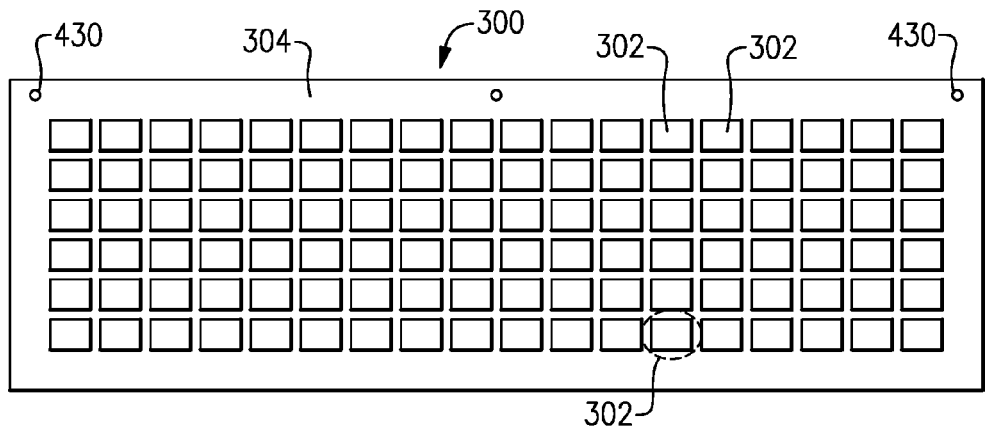
FIG. 7A shows a plan view of a frame carrier that is similar to the example of FIG. 5, but without a tape.
Figure 7B:
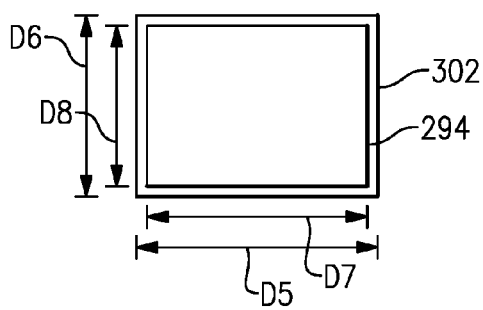
FIG. 7B shows a more detailed view of one of the apertures of the frame carrier of FIG. 7A.

FIG. 7A shows a plan view of a frame carrier 300 that is similar to the example of FIG. 5, but without the tape (306 in FIG. 5). The frame carrier 300 is shown to include a plate 304 that defines an array of rectangular shaped apertures 302. FIG. 7B shows a more detailed view of one of the apertures 302. It will be understood that other shapes can also be implemented for the apertures 302.

The plate 304 can also define one or more features 430 configured to provide indexing and/or alignment functionality. Such features can be utilized during, for example, loading and unloading of individual units, and processing of the individual units placed in the apertures 302.

In FIG. 7B, an aperture 302 is depicted as a rectangle having dimensions d5 and d6. An individual unit 294 having dimensions d7 and d8 is shown to be positioned within the d5×d6 dimensions of the aperture 302. Preferably, the aperture's dimensions (d5×d6) are selected to allow precise fit of the individual unit 294, but not too close to the dimensions (d7×d8) of the individual unit 294 to make loading and unloading difficult.

Figure 8A:
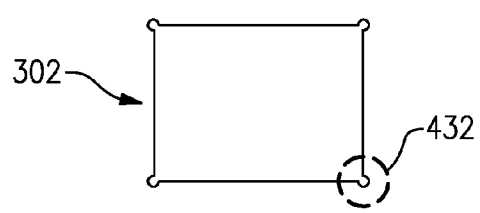
FIG. 8A shows that in some embodiments, an aperture of a frame carrier can include relief features at some or all of the corners.
Figure 8B:
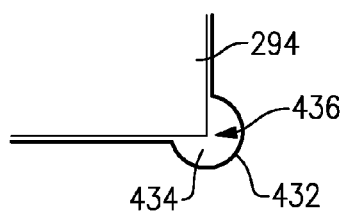
FIG. 8B shows an expanded view of one corner of the aperture of FIG. 8A.

FIG. 8A shows that in some embodiments, each aperture 302 of a frame carrier 300 can include relief features 432 at some or all of the corners. FIG. 8B shows an expanded view of one corner of the aperture 302 of FIG. 8A.

In FIG. 8B, an individual unit 294 is shown to have a close fit within the rectangular boundary of the aperture 302. If the corner relief features 432 are not present, each corner can have a radius due to tolerances associated with formation of the aperture 302. Such a radius can interfere with fitting of a sharp corner 436 of the individual unit 294.

As shown in FIG. 8B, the corner relief feature 432 can be dimensioned to provide an opening 434 dimensioned to remove the corner radius. Accordingly, the individual unit 294 can fit closely within the aperture 302 without the corners of the aperture 302 interfering with the sharp corners 436 of the individual unit 294.

As described in reference to FIGS. 5 and 6, a tape attached to an underside of a frame carrier (with the adhesive side exposed through the apertures) allows individual units to be positioned and held in the apertures for further processing.

Preferably, such a tape is capable of handling high temperatures and/or cleaning operations. For example, a high-temperature silicone tape can withstand operations such as reflow operations at a temperature of about 260° C., curing operations at temperatures from about 150° C. to about 200° C., solvent cleaning operations, and plasma cleaning operations.

Figure 9:
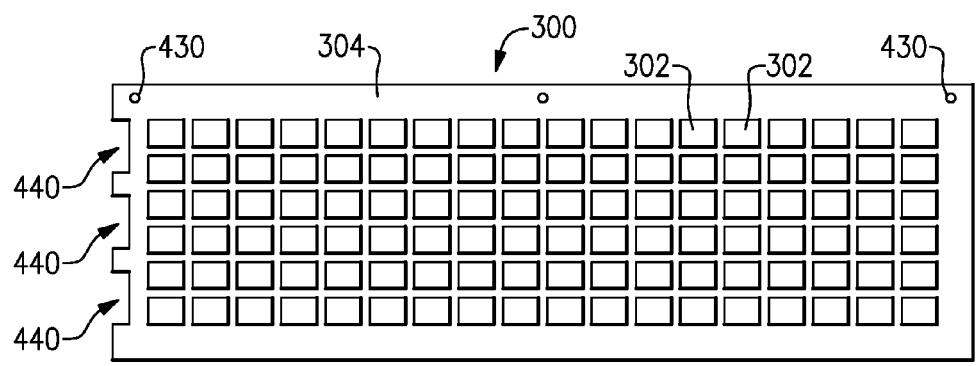
FIG. 9 shows an example frame carrier having tape-removal notches implemented on a side edge.

FIGS. 9-13 show that in some embodiments, a frame carrier 300 can include one or more tape-removal features such as notches to facilitate easier removal of a tape from the underside of the frame carrier 300. FIG. 9 shows an example frame carrier 300 having three example tape-removal notches 440 implemented on the left edge. Other features of the frame carrier 300 can be similar to the example of FIG. 7A.

Figure 10:
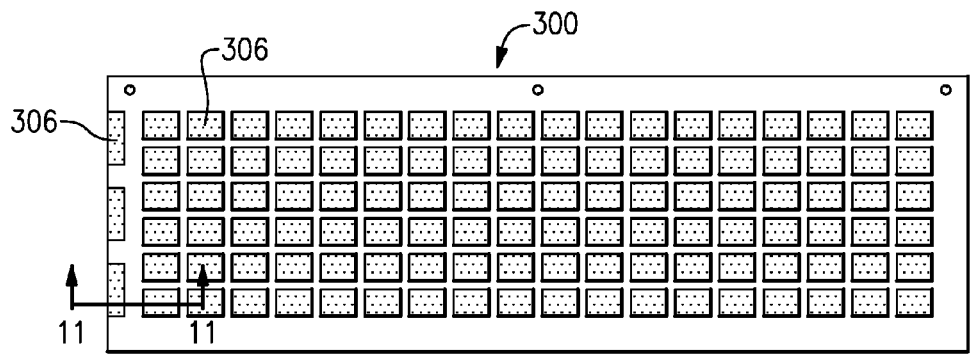
FIG. 10 shows the frame carrier of FIG. 9 with a tape attached to its underside.

FIG. 9 shows the frame carrier 300 without a tape. FIG. 10 shows the frame carrier 300 with a tape 306 attached to its underside. More detailed side views of a portion of one of the tape-removal notches 440 and a nearby aperture 306 are shown in greater detail in FIG. 11 for example processing steps.

Figure 11A:
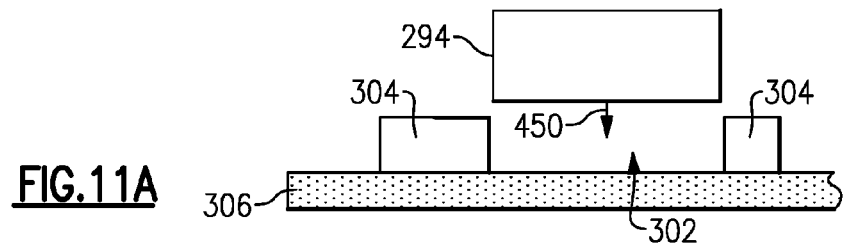
FIGS. 11A-11E show an example of how a plurality of individual units can be loaded onto a frame carrier having one or more features as described herein, and be processed as if the individual units are in a panel format.

In FIG. 11A, the tape 306 is shown to be attached to the underside of the plate 304 of the frame carrier 300, such that an adhesive side of the tape 306 is exposed through the aperture 302. As described herein, such a configuration allows an individual unit to be positioned and temporarily held in place in the aperture 302 during further processing. As shown, an individual unit 294 is shown to be in the process of being placed (arrow 450) into the aperture 302.

Figure 11B:
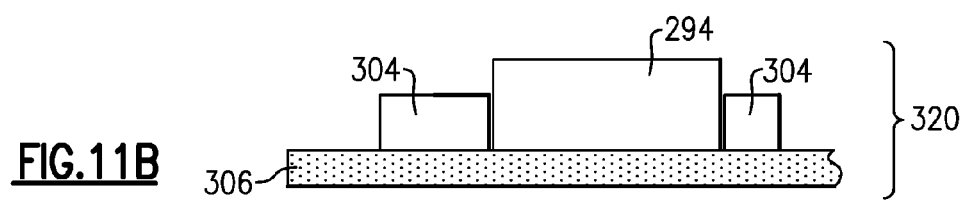

In FIG. 11B, the individual unit 294 is shown to be positioned within the aperture 302 of the plate 304, and held therein by the tape 306. It will be understood that other individual units can be positioned and held within their respective apertures of the plate 304. Accordingly, the plate 304 and the individual units 294 held within the respective apertures by the tape 306, collectively indicated as 320, can allow the individual units to be further processed as if they are still in a panel format.

Figure 11C:
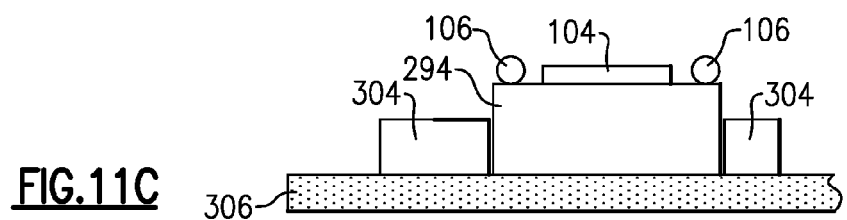

FIG. 11C shows a state where processing of the underside of the individual unit 294 has been completed. It will be understood that other individual units being held in the same frame carrier will also have their undersides processed. In FIG. 11C, the example underside processing is shown to yield a lower component 104 and a BGA 106 being implemented on the underside of the individual unit 294. It will be understood that processing of other types of individual units can also be facilitated by the frame carrier 300.

Figure 11D:
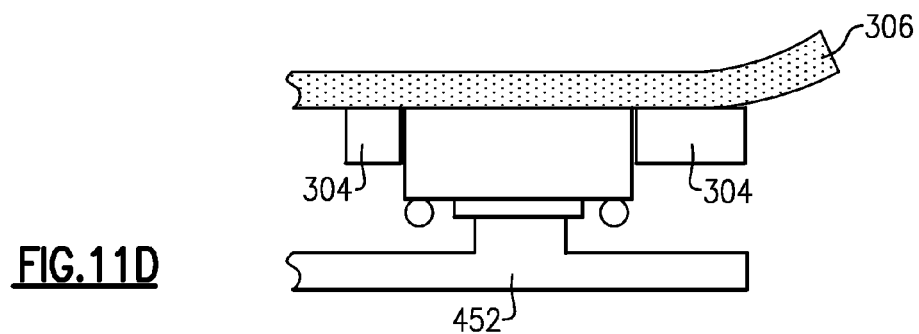

FIG. 11D shows that, upon completion of such underside processing, the assembly of the array of processed individual units, the tape 306, and the plate 304 can be flipped. In such an orientation, the processed individual units can be held in place by, for example, a vacuum apparatus 452. With the processed individual units held in place in such a manner, the tape 306 can be removed from the underside of the plate 304 (now facing upward) and the upper sides (also facing upward) of the processed individual units. As described herein, the tape-removal notches 440 (FIGS. 9, 10) can facilitate easier removal of the tape 306.

Figure 11E:
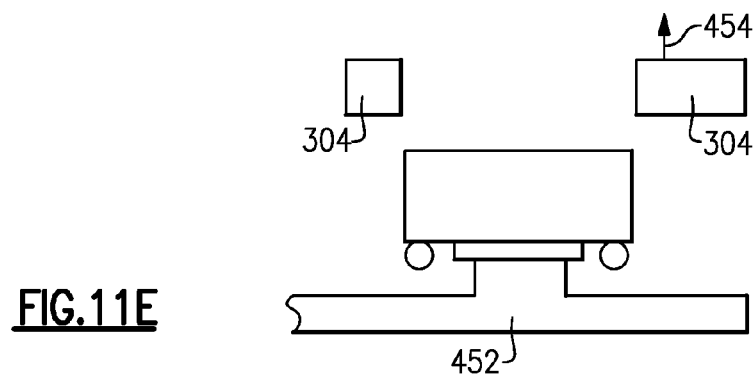

FIG. 11E shows a state where the tape 306 has already been removed, and where the plate 304 is also being removed (arrow 454). Such a removal of the plate 304 is shown to leave an array of processed individual units held in place by the vacuum apparatus 452. Such an array of processed individual units can be, for example, flipped and placed into a film frame, tray or bulk container, etc., depending on a particular process.

In the foregoing example of FIGS. 11A-11E, individual units 294 are shown to be loaded onto the frame carrier 300 in FIG. 11A so as to yield the assembly 320 of FIG. 320. More particularly, a given individual unit 294 is shown to be placed into the corresponding aperture 302, to be adhered to the tape 306 already in place. FIGS. 12 and 13 show non-limiting examples of how such loading of the frame carrier 300 can be varied.

Figure 12A:
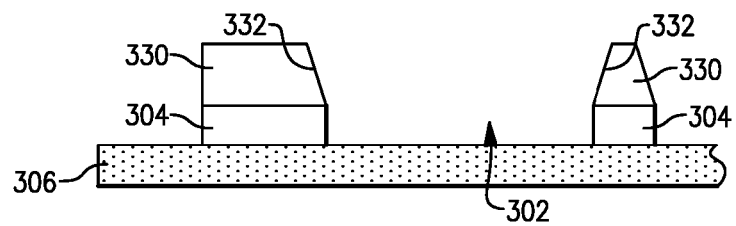
FIGS. 12A-12C show another example of how a plurality of individual units can be loaded onto a frame carrier.
Figure 12B:
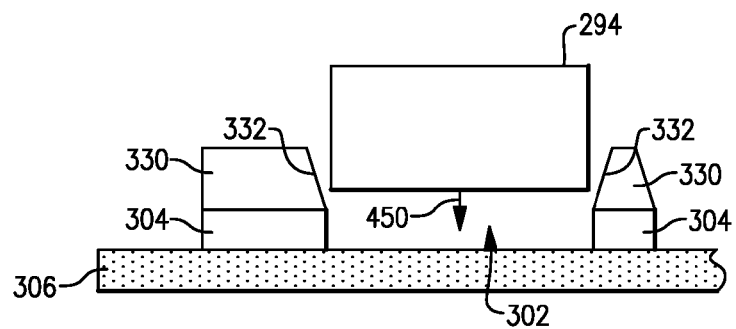
Figure 12C:
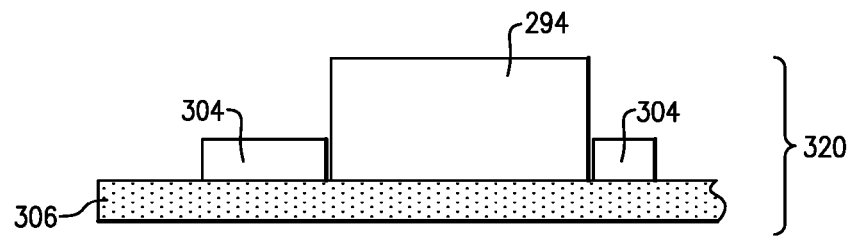

FIGS. 12A-12C show an example loading configuration that is similar to the example of FIG. 11A, but in which a loading plate 330 can be utilized. As shown in FIG. 12A, such a loading plate can include an aperture corresponding to each aperture 302 of the plate 304 of the frame carrier 300. Such an aperture of the loading plate 330 can have a beveled wall 332 dimensioned to allow easier insertion of an individual unit being placed into the aperture 302 of the plate 304. Accordingly, the loading plate 330 can be positioned over the plate 304, such that the beveled-wall apertures of the loading plate 330 align appropriately with the corresponding apertures 302 of the plate.

In FIG. 12B, an individual unit 294 is shown to be inserted (arrow 450) into the aperture 302 of the plate 304. Such an insertion of the individual unit 294 can be facilitated by the loading plate 330. It will be understood that other individual units can be inserted into their respective apertures in a similar manner.

In FIG. 12C, the individual units 294 have been placed within the respective apertures (302) of the plate 304, and are being held therein by a tape 306. Further, the loading plate (330) is shown to have been removed. Accordingly, and similar to the example of FIG. 11B, the plate 304 and the individual units 294 held within the respective apertures by the tape 306 (collectively indicated as 320) can allow the individual units to be further processed as if they are still in a panel format.

In the examples of FIGS. 11 and 12, the tape 306 is pre-attached to the underside of the plate 304 so as to receive and retain the individual units placed in the apertures 302. In some applications, it may be desirable to place the individual units within the apertures before such a tape is applied.

Figure 13A:
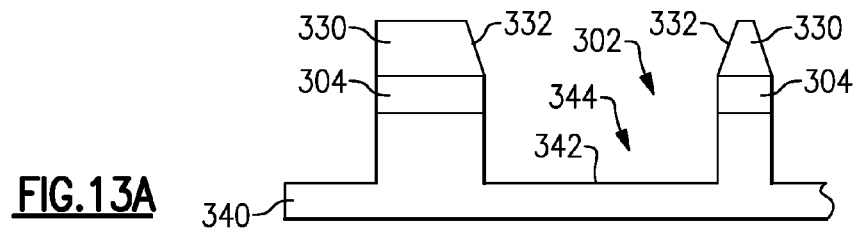
FIGS. 13A-13E show yet another example of how a plurality of individual units can be loaded onto a frame carrier.

FIGS. 13A-13E show an example of how individual units can be placed within an array of apertures of a frame carrier first, followed by an application of a tape to hold such individual units. FIG. 13A shows that in some implementations, a vacuum apparatus 340 can be utilized to temporarily hold individual units in place prior to application of a tape. For example, such a vacuum apparatus can include an array of openings 344, with each opening having a surface 342 configured to provide suction. Such an opening can be dimensioned to match with a corresponding aperture 302 of a plate 304 of a frame carrier.

In some embodiments, the vacuum apparatus 340 can include elevated portions dimensioned to support the plate 304 and define the opening 344, such that an individual unit placed through the aperture 302 of the plate 304 can be positioned within the opening 344. In the example of FIG. 13A, a loading plate 330 similar to the example of FIG. 12A is shown to be utilized. It will be understood that such a loading plate may or may not be utilized.

Figure 13B:
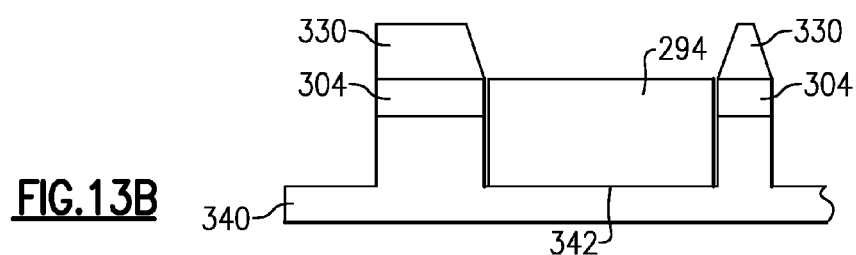

In FIG. 13B, an individual unit 294 is shown to be placed within the opening 344. It will be understood that other individual units can be placed in their respective openings of the vacuum apparatus. Each individual unit 294 can engage the surface 342; and upon application of suction, be temporarily held within the opening.

Figure 13C:
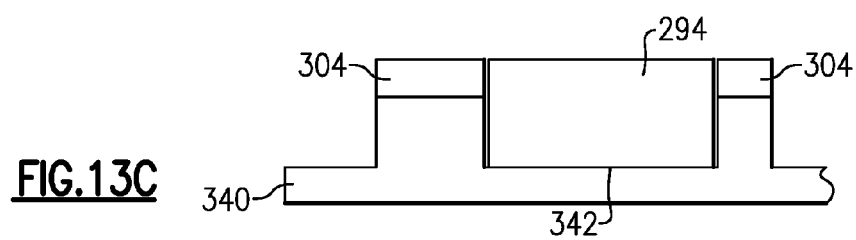

In FIG. 13C, the loading plate (330) is shown to have been removed so as to expose the plate 304. In some embodiments, the opening (344) of the vacuum apparatus 340 and the plate 304 can be dimensioned such that the upper surface of the individual unit 294 is approximately co-planar with the upper surface of the plate 304. Such a configuration can allow easier application of a tape.

Figure 13D:
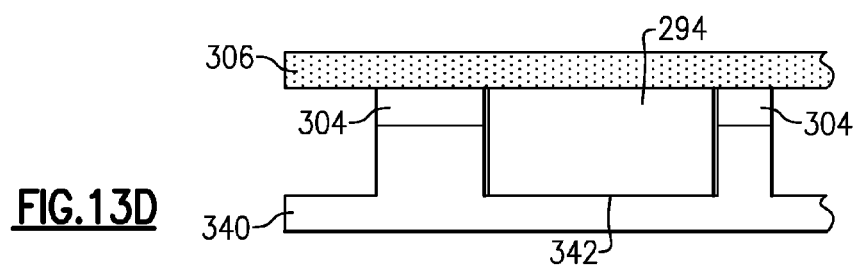

In FIG. 13D, a tape 306 is shown to be applied over the plate 304 and the individual units 294. In the example orientation shown in FIG. 13D, the underside of the tape 306 can be the adhesive side, such that the individual units 294 are now held within the apertures (302) of the plate 304 by the tape 306.

Figure 13E:
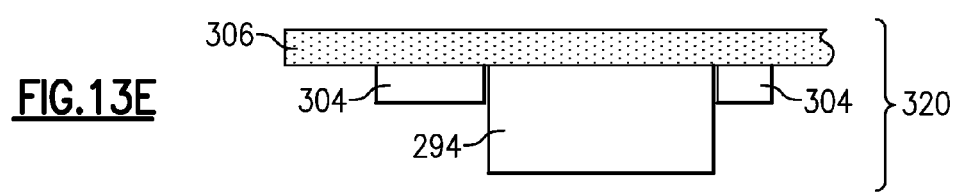

In FIG. 13E, an assembly of the individual units 294, the plate 304, and the tape 306 are shown to have been separated from the vacuum apparatus (e.g., by turning off the suction). Accordingly, and similar to the example of FIG. 11B, the plate 304 and the individual units 294 held within the respective apertures by the tape 306 (collectively indicated as 320) can allow the individual units to be further processed as if they are still in a panel format.

As described in reference to the examples of FIGS. 11-13, a frame carrier 300 that is loaded with an array of individual units can be handled for further processing as if the individual units are still in a panel format. For example, a plurality of such loaded frame carriers can be inserted into a magazine for batch processing, similar to batch processing of panels. Such a magazine and related equipments can be configured for processing of panels. Because of the use of frame carriers, such processing equipments can also be utilized for batch processing of individual units with little or no modification.

In some embodiments, a frame carrier 300 having one or more features as described herein can be configured to hold a plurality of singulated devices during a process where shielding features are formed on each of the singulated devices. For example, conformal shielding layers can be formed on the singulated devices utilizing a layer-formation process (e.g., sputter deposition process). Additional details concerning such a layer-formation process on singulated devices being held by a frame carrier can be found in the above-referenced U.S. Provisional Application No. 62/031,815.

Figure 14:
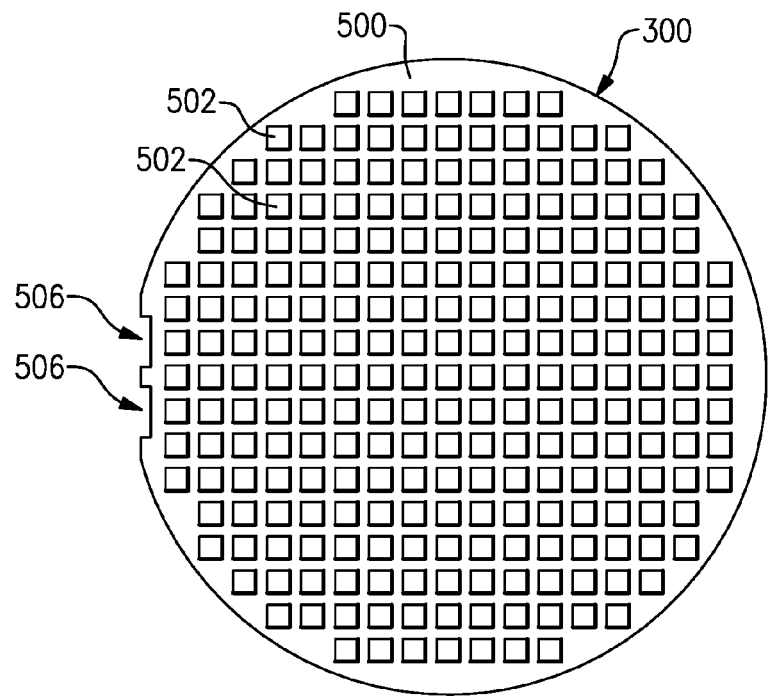
FIG. 14 shows that in some embodiments, a frame carrier having having one or more features as described herein can have a shape other than a rectangular shape.

FIG. 14 shows that in some embodiments, a frame carrier 300 having one or more features as described herein can have a shape other than the rectangular shape utilized in various examples. For example, the frame carrier 300 in FIG. 14 is shown to have a wafer-like form (e.g., circular shape). Such a shape can facilitate easier implementation in some process step(s) (e.g., a sputter deposition step) in which an apparatus may be configured to hold a wafer.

In the example of FIG. 14, the frame carrier 300 is shown to include a wafer-shaped plate 500 that defines an array of apertures 502 for receiving singulated devices. In some embodiments, the plate 500 can also include one or more tape removal features such as notches 506 configured to facilitate easier removal of a tape (not shown) that can be provided on the underside of the plate 500. In some embodiments, the plate 500 can also include one or more indexing and/or alignment features. In some embodiments, some or all of the tape removal features can be utilized for providing such indexing and/or alignment functionalities.

In the example of FIG. 14, the apertures 502 are depicted as being arranged throughout the entire region of the plate 500. In some deposition applications, there may be a distribution in deposition rate as a function of, for example, angle relative to a center axis. In such a situation, it may be desirable to position the apertures 502 in a selected annular region.

Figure 15:
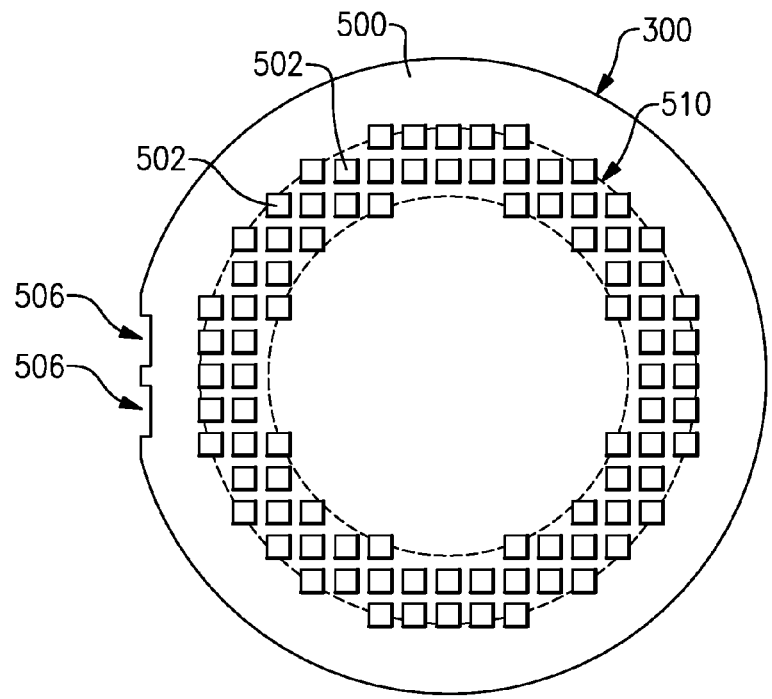
FIG. 15 shows an example configuration where a selected annular region can define a plurality of apertures for holding singulated devices during a deposition process.

FIG. 15 shows an example configuration where a selected annular region 510 defines a plurality of apertures 502 for holding singulated devices during a deposition process (e.g., a sputter deposition process). Thus, when the frame carrier 300 is rotated about the center axis during the deposition process, formation of the conformal shielding layers can be achieved with a desired deposition rate and desired uniformity.

In the example of FIG. 15, the apertures 502 are depicted as being present within the annular region 510. It will be understood that there may be other apertures on the same plate 500, such as in the example of FIG. 14. In such an example, only selected apertures (e.g., ones in the annular region) can be loaded with singulated devices to achieve similar functionality.

It will also be understood that the apertures 502 in FIGS. 14 and 15 do not necessarily need to be arranged in a rectangular arrangement in which the neighboring sides of the apertures are parallel. In some embodiments, apertures can be arranged to be in a non-rectangular arrangement. For example, such apertures can be arranged with circular symmetry about the center axis.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A device for processing singulated radio-frequency (RF) packages, the device comprising a plate having a plurality of apertures, each aperture dimensioned to receive and position a singulated radio-frequency package to thereby facilitate processing of the singulated radio-frequency packages positioned in their respective apertures.

2. The device of claim 1 wherein each of the apertures has a rectangular shape having dimensions selected to allow the receiving and positioning of the singulated radio-frequency package therein.

3. The device of claim 2 further comprising a relief feature at one or more corners of each rectangular shaped aperture, each relief feature dimensioned to allow fitting of a corresponding corner of a respective singulated radio-frequency package.

4. The device of claim 1 wherein the plate includes one or more features configured to provide indexing and/or alignment functionality.

5. The device of claim 4 wherein the plate has a rectangular shape.

6. The device of claim 5 wherein at least some of the one or more indexing/alignment features are positioned along a selected edge of the rectangular plate.

7. The device of claim 1 wherein the plate includes an upper side and a lower side, the lower side configured to receive a tape such that the apertures expose respective portions of an adhesive side of the tape to thereby facilitate holding of the singulated radio-frequency packages positioned in the apertures.

8. The device of claim 7 wherein the plate includes one or more tape-removal features configured to facilitate removal of the tape from the lower side of the plate.

9. The device of claim 1 wherein the plate has a wafer-like shape.

10. The device of claim 1 wherein the apertures are dimensioned to receive and position the singulated radio-frequency packages to facilitate a conformal shield deposition process.

11. The device of claim 1 wherein the plate has a thickness selected to allow the singulated radio-frequency packages to be positioned and retained in their respective apertures in a desired manner during the processing of the singulated radio-frequency packages.

12. A method for processing singulated radio-frequency (RF) packages, the method comprising:
positioning a plurality of singulated radio-frequency packages into respective apertures defined by a plate, such that the singulated radio-frequency packages are held in an array; and
performing one or more process steps on the singulated radio-frequency packages while the singulated radio-frequency packages are held by the plate.

13. The method of claim 12 further comprising applying a tape on one side of the plate that defines the apertures, such that respective portions of an adhesive side of the tape are exposed through the apertures.

14. The method of claim 12 further comprising:
applying vacuum to the singulated radio-frequency packages positioned in their respective apertures of the plate; and
performing the one or more process steps on the singulated radio-frequency packages while the singulated radio-frequency packages are held in the array at least in part by the vacuum.

15. The method of claim 14 further comprising applying a tape on one side of the plate after the singulated radio-frequency packages are being held by the vacuum, such that respective portions of an adhesive side of the tape engage the plate and respective portions of the adhesive side of the tape engage corresponding portions of the singulated radio-frequency packages.

16. The method of claim 15 further comprising removing the vacuum applied to the singulated radio-frequency packages such that the singulated radio-frequency packages remain in the array by the plate and the tape.

17. The method of claim 12 wherein the one or more process steps performed on the singulated radio-frequency packages include forming dual-sided packages.

18. A system for batch processing of singulated radio-frequency (RF) packages, the system comprising:
an apparatus configured for holding singulated radio-frequency packages, the apparatus including a plurality of frame carriers, each frame carrier having a plurality of apertures dimensioned to receive and position an array of singulated radio-frequency packages; and
a handling apparatus configured to receive the plurality of frame carriers, each frame carrier loaded with a respective array of singulated radio-frequency packages, the handling apparatus further configured to allow batch processing of the singulated radio-frequency packages loaded in their respective frame carriers.

19. The system of claim 18 wherein the apparatus configured for holding singulated radio-frequency packages includes a loading plate configured to be positioned over a respective frame carrier as the respective array of radio-frequency packages is being positioned in the apertures of the respective frame carrier, the loading plate including a plurality of loading apertures, each loading aperture including beveled side walls dimensioned to facilitate easier positioning of a respective radio-frequency package into a corresponding aperture of the respective frame carrier.

20. The system of claim 18 wherein the handling apparatus includes a magazine configured to receive the plurality of frame carriers loaded with singulated radio-frequency packages, the magazine further configured to facilitate the batch processing of the singulated radio-frequency packages loaded in the frame carriers as if they are still in a panel format.

* * * * *